United States Patent [19]

Kawasaki et al.

[11] Patent Number: 4,945,247
[45] Date of Patent: Jul. 31, 1990

[54] FIELD EMISSION ELECTRON GUN SYSTEM

[75] Inventors: Takeshi Kawasaki; Junji Endo, both of Kokubunji; Shigeto Isakozawa; Masahiro Tomita, both of Katsuta; Akira Tonomura, Koganei, all of Japan

[73] Assignee: Hitachi, Ltd., Tokyo, Japan

[21] Appl. No.: 365,827

[22] Filed: Jun. 14, 1989

[30] Foreign Application Priority Data

Jun. 17, 1988 [JP] Japan ................................ 63-148105

[51] Int. Cl.$^5$ ........................................... H01J 37/073
[52] U.S. Cl. ................................ 250/423 F; 313/156; 313/443
[58] Field of Search ....... 250/396 R, 396 ML, 423 R, 250/423 F; 313/153, 155, 156, 162, 443, 336

[56] References Cited

U.S. PATENT DOCUMENTS

| | | | |
|---|---|---|---|
| 4,315,152 | 2/1982 | Smith | 250/396 ML |
| 4,544,845 | 10/1985 | Michel | 250/423 F |
| 4,725,736 | 2/1988 | Crewe | 250/396 ML |
| 4,782,235 | 11/1988 | Lejeune et al. | 250/423 R |

FOREIGN PATENT DOCUMENTS

| | | |
|---|---|---|
| 3345573 | 6/1985 | Fed. Rep. of Germany ... 250/423 R |
| 5942748 | 5/1982 | Japan . |
| 1291221 | 10/1972 | United Kingdom . |

Primary Examiner—Jack I. Berman
Attorney, Agent, or Firm—Antonelli, Terry, Stout & Kraus

[57] ABSTRACT

In a field emission electron gun system with a multi-stage acceleration tube comprising a field emission electron source, a field emission electrode for extracting the electrons, a magnetic lens having a magnetic gap between the field emission electron source and the field emission electrode or a magnetic lens having a magnetic pole which also serves as the field emission electrode, and at least two-stages of acceleration electrodes for accelerating the electrons, a magnetization current I for the magnetic lens is changed interlocking with a field emission voltage $V_1$ applied between the field emission electron source and the field emission electrode so that $IN/\sqrt{V_1}$ (N: the number of windings of the magnetic lens) takes a predetermined value and a first acceleration voltage $V_2$ applied between the field emission electron source and the first-stage acceleration electrode is changed interlocking with the field emission voltage $V_1$ so that $V_2/V_1$ takes a predetermined value.

6 Claims, 4 Drawing Sheets

FIELD EMISSION ELECTRON GUN SYSTEM

BACKGROUND OF THE INVENTION

The present invention relates to an electron gun system suitable for use in an electron microscope, an electron beam lithography or the like, and more particularly to the improvement on a field emission electron gun system suitable for acquisition of a high-brightness and large-current electron beam.

In the conventional field emission electron gun system, approaches of acquiring a large-current electron beam by use of not only an electronic beam focusing action with an electrostatic lens but also a magnetic beam focusing action with a magnetic lens disposed in the vicinity of an electron source have been disclosed by British Patent No. 1,291,221 and JP-A-59-42748.

In order to obtain a desired focused electron beam in using an electron gun in a transmission or scanning electron microscope, an electron beam lithography or the like, there is usually employed an illuminating system, that is, a system in which the electron gun is combined with a condenser lens(es). However, the luminance level (or brightness) of the electron beam obtained becomes lower than that of an electron source itself due to aberrations of the electron gun and the condenser lens. In order to obtain a high-brightness electron beam, it is important to reduce the aberrations of the illuminating system (mainly including spherical aberration and chromatic aberration) as greatly as possible, thereby maintaining the luminance level intrinsically possessed by the electron gun.

Electrons undergo an electrostatic lens action when they are accelerated in an electron gun. In the conventional illuminating system in electron microscopes or the like, there cannot exist together a condition that the aberration of the electrostatic lens in the electron gun is small and a condition that the aberration of the condenser lens is small. The spherical aberration and chromatic aberration of the electrostatic lens in the electron gun is about ten times as great as those of a magnetic lens used in an electron microscope or the like. Therefore, a magnetic lens is provided in the vicinity of the electron source for the purposes of reducing the aberration of the electron gun and making up for the electrostatic lens action and the electrostatic lens action is controlled to allow the system to operate in a condition in which the aberration of the condenser lens becomes small. As a result, a high-brightness and large-current electron beam is obtained.

The electron gun systems according to the prior art mentioned in the above employ a single-stage acceleration tube used when an acceleration voltage is low. Therefore, an electron accelerating region is short in distance and an electrostatic lens action is weak. Further, since the distance between the condenser lens and the electron source is also short, the aberration caused by reducing the beam size by the condenser lens is also small. Accordingly, no substantial problem has arisen in the conventional electron gun systems with the single-stage acceleration tube used under a low acceleration voltage condition. However, a magnetic field superposed field emission electron gun system with a multi-stage acceleration tube used under a high acceleration voltage condition has involves problem. Namely, when a real image of a field emission electron source is formed in a direction of progression of an electron beam by a magnetic lens, as disclosed by the JP-A-59-42748, a strong electrostatic lens action makes large the angle of incidence of the electron beam upon a condenser lens. Also, in the magnetic field superposed field emission electron gun system using the multi-stage acceleration tube, since an electron accelerating region is long, the distance from the field emission electron source to the condenser lens is long and hence the greater degree of reduction of the beam size by the condenser lens is required for allowing the formation of a beam spot by the condenser lens. This results in the deterioration of brightness due to the spherical aberration of the condenser lens. Thus, a condition in the magnetic field superposed field emission electron gun system with the multi-stage acceleration tube for acquiring a high-brightness and large-current electron beam by the illuminating system in the combination of the electron gun with the condenser lens is different from that in the field emission electron gun with the single-stage acceleration tube. Further, in the electron gun system according to the prior art mentioned above, no consideration is made with a view to keeping the illuminating conditions such as the electron beam spot position and the beam divergence angle unchanged when the operating conditions of the electron gun such as the field emission voltage and the acceleration voltage are changed. Also, in the case of the magnetic field superposed field emission electron gun system using the multi-stage acceleration tube, since a high voltage is applied, there is a large danger that a discharge may occur. Therefore, it is necessary to provide a power source construction which is not liable to undergo any damage even upon occurrence of the discharge at the electron gun or the high-voltage sources. However, when the conventional construction is employed for a power source for applying a field emission voltage, a power source for applying a voltage to a first-stage acceleration electrode and a power source for applying voltages to second-stage to final-stage acceleration electrodes, there is a problem that it is hard to take a protective measure to counter the discharge since there becomes large a possibility that a discharge current flows between a plurality of power sources when the output of each power source is short-circuited by the discharge.

SUMMARY OF THE INVENTION

An object of the present invention is to realize a magnetic field superposed field emission electron gun system with a multi-stage acceleration tube which is provided with an excellent operability or an ability of keeping the illuminating conditions unchanged even upon change of the operating conditions of the electron gun and with a highly resistive power source construction hard to undergo any damage even upon occurrence of a discharge at the electron gun and/or the power sources and is capable of obtaining always and stably a high-brightness and large-current electron beam even if the electron gun is combined with a condenser lens.

The above object can be achieved by a magnetic field superposed field emission electron gun system with a multi-stage acceleration tube, constructed as shown in FIG. 1, characterized in (1) that a virtual image of a field emission electron source 4 (four) to 10 (ten) times as great as the field emission electron source is produced by use of a magnetic lens and a real image of the field emission electron source 0.3 to 3 (three) times as great as the virtual image is formed by an electrostatic lens, (2) that a current I flowing through a coil forming the magnetic lens is changed interlocking with a field emission voltage $V_1$ so that the ratio of the strength IN (N: the number of windings of the coil) of magnetization of the coil to the square root of the field emission voltage $V_1$ takes a predetermined value within a range of $7 \leq IN/\sqrt{V_1} \leq 12$ and a voltage $V_2$ applied to a first-state acceleration electrode is changed interlocking with the field emission voltage $V_1$ so that the ratio of $V_2$ to $V_1$ takes a predetermined value within a range of $5 \leq V_2/V_1 \leq 10$, and (3) that a power source ($V_1$ source) for supplying the field emission voltage $V_1$, a power source ($V_2$ source) for applying the voltage of $V_2$ to the first-stage acceleration electrode and a power source ($V_0$ source) for applying predetermined voltages to second-stage to final-stage acceleration electrodes are all connected in series with each other.

Functional effects provided by the abovementioned constitutional features of the present invention can be roughly mentioned as follows.

When a potential $\phi$ changes from $\phi(0)=\phi_0$ to $\phi(L)=\phi_1$ in a length range of L, an electrostatic lens action at that portion can be represented by $$\frac{1}{f_1} = \frac{3}{16} \left(\frac{\phi_0}{\phi_1}\right)^{\frac{1}{2}} \int_0^L \left(\frac{\phi'}{\phi}\right)^2 dz \quad (1)$$

where $f_1$ is the focal length of the electrostatic lens on its image plane side, $\phi'$ is $d\phi/dz$ and the z-axis is the direction of progression of electrons. As is apparent from this, the electrostatic lens action becomes large at a location where the potential $\phi$ is low and the potential gradient $\phi'$ along the z-axis is large. Namely, in the electron gun, the electrostatic lens action is concentrated between the field emission electrode and the first-stage acceleration electrode. Since the potential gradient between the field emission electrode and the first stage acceleration electrode can be made approximately constant, $f_1$ can be made constant if $V_2/V_1$ is kept constant. Namely, the lens action can be controlled by the value of $V_2/V_1$.

It is known that the lens action of a magnetic lens can be well approximated by the experimental equation of $$\frac{1}{f_1} = \frac{1}{50\sqrt{DL}} \left(\frac{IN}{\sqrt{V}}\right)^2 \quad (2)$$

where $f_1$ is the focal length of the magnetic lens on its image plane side, I the current flowing through a coil forming the magnetic lens, N the number of windings of the coil, V the voltage for acceleration of electrons, D the diameter of the hole of a magnetic pole of the lens, and L the distance between the upper and lower magnetic poles of the lens (or the gap length). The lens action of the magnetic lens can be controlled by changing the value of $IN/\sqrt{V}$. In Figs. 2 and 3, the curves represent the following listed aberrations:

A represents chromatic aberration of the magnetic lens;
a represents spherical aberration of the magnetic lens;
B represents chromatic aberration of the electronic lens;
b represents spherical aberration of the electrostatic lens;
C represents chromatic aberration of the condenser lens; and
c represents aberration of condenser lens;
E represents diffraction aberration.

FIG. 2 shows an example of the relationship between the aberrations of an electrostatic lens and a condenser lens and the value of $V_2/V_1$ plotted for the conventional field emission electron gun system using the multi-stage acceleration tube. In FIG. 2, the abscissa represents the value of $V_2/V_1$ and the ordinate represents the ratio $\Delta$ of the blur (spread of spot size) induced by the spherical aberration or chromatic aberration of each lens to the non-aberration spot size. As the ratio $\Delta$ of the aberration induced blur (spot size spread) to the non-aberration spot size becomes large, the brightness is lowered. In the shown example, it is seen from the figure that sufficient brightness and beam current cannot be obtained due to the aberration of the condenser lens unless the system is used within a range of $V_2/V_1 = 11$ to 14. However, since $V_2$ comes up to 60 to 80 KV under such a condition, the realization of this condition is difficult when taking the danger of a discharge and/or the construction of power sources into consideration. On the other hand, if the value of $V_2/V_1$ is too small, the control of the electrostatic lens action becomes difficult since the electrostatic lens action in the second-stage acceleration region becomes strong. A range of values of $V_2/V_1$ which can be easily realized is 5 to 10. In the present invention, a high-brightness and large-current electron beam can be obtained since the aberration of the electrostatic lens is made small by holding $V_2$ in a low value and making up for the electrostatic lens action by virtue of the magnetic lens provided in the vicinity of the electron source and the magnetic lens is operated such that the aberration of the condenser lens becomes small.

FIG. 3 shows an example of the relationship between the aberrations of a magnetic lens, an electrostatic lens and a condenser lens and the operating conditions of the magnetic lens plotted for a magnetic field superposed field emission electron gun system using a multi-stage acceleration tube. In the figure, the abscissa represents the magnification of a virtual image formed by the magnetic lens, together with the focal length of the magnetic lens and the value of $IN/\sqrt{V_1}$ that time, and the ordinate represents the ratio $\Delta$ of the blur induced by the spherical aberration or chromatic aberration of each lens to the non-aberration spot size. In the shown example, it is seen from the figure that the influence of aberration is the least in the vicinity of a portion where the magnification of the virtual image is equal to 6. If taking the above-mentioned aberration of the condenser lens into consideration, conditions favorable to each lens in view of the incidence angle and the magnification are to form a virtual image of the electron source 4 (four) to 10 (ten) times as great as the electron source by the magnetic lens and to form a real image of the electron source 0.3 to 3 (three) times as great as the virtual image between the center of the acceleration tube and the condenser lens by the electrostatic lens where $V_2/V_1$ is 5 to 10. Under such conditions, $\Delta$ for the electron gun, $\Delta$ for the condenser lens and $\Delta$ for the diffraction aberration can be made substantially equal to each other to minimize the aberration of the overall illuminating system, thereby making it possible to obtain the highest brightness and the largest current.

Next, explanation will be made of the construction of a magnetic field superposed field emission electron gun system with a multi-stage acceleration tube according to the present invention. The dimensions and function and of each component of the electron gun system can be determined from the optimum conditions for use of the magnetic field superposed field emission electron gun system with the multi-stage acceleration tube which conditions have been revealed above in conjunction with FIG. 3. In the case of the magnetic field superposed field emission electron gun system with the multi-stage acceleration tube, since the virtual image of the electron source is formed unlike the case of the conventional field emission electron gun system with the single-stage acceleration tube, a strong magnetic field as required in the conventional system is not necessary for the magnetic lens. As for the dimensions of the magnetic lens, the diameter $D_1$ of a hole of the upper magnetic pole may be 4 mm to 10 mm. When the hole diameter $D_1$ of the upper pole is smaller than 4 mm, the high brightness cannot be obtained due to off-axis aberration unless the axis of the electron source and the axis of the magnetic lens are aligned with each other with a precision smaller than 50 μm. But, the attainment of such a precision is difficult. On the other hand, when $D_1$ is greater than 10 mm, the magnetic field is so weak that the size of the coil and the capacity of the power source for the magnetic lens must be inadmissibly increased. As for a gap length L between the upper magnetic pole and the lower magnetic pole of the magnetic lens, a range of $D_1 \leq L \leq D_2$ ($D_2$: the diameter of a hole of the lower pole) is proper when taking the magnetic field strength required and the magnitude of a leakage magnetic field into consideration. In order to minimize the aberrations of the magnetic lens and the electrostatic lens, it is necessary to make the distance between the electron source and the magnetic lens and the distance between the electron source and the electrostatic lens as short as possible. In order to allow the principal surface of the magnetic lens to come near the electron source, the hole diameter $D_2$ of the lower pole is made greater than the hole diameter $D_1$ of the upper pole. Also, in order to make the distance between the electron source and the electrostatic lens as short as possible, the distance between the electron source and an electron beam permeable hole provided in the lower pole of the magnetic lens or a surface of the field emission electrode opposing the first-stage acceleration electrode is held in a value not greater than 20 mm. Since the operating conditions and dimensions of the magnetic lens have been thus established, it can be derived from equation (2) that the value of $IN/\sqrt{V_1}$ is preferably in a range of 7 to 12.

FIG. 4 shows an example of the results of computation of the position of an image of the electron source in the case where the field emission voltage $V_1$ is changes in the magnetic field superposed field emission electron gun system with the multi-stage acceleration tube constructed as shown in FIG. 1. In the figure, the ordinate represents the distance FP from the electron source to the image thereof with the direction of progression of the electrons taken as the positive sense of the distance FP, and the abscissa represents the field emission voltage $V_1$. A range indicated by A in FIG. 4 is a region where both the electron gun and the condenser lens can be used under small-aberration conditions. When the field emission voltage $V_1$ is changed by 100 V, the position of the image of the electron source is changed by 300 mm. In order to keep the illuminating conditions constant, fine adjustments of the coil current I and the voltage $V_2$ to be applied to the first-stage acceleration electrode must be simultaneously made in units of 0.1 mA for the coil current and in units of 10 V for the voltage $V_2$. Further, the amount of correction by the fine adjustment may change depending on the value of $V_1$. The execution of such adjustments by manual operation is very inconvenient in-practice and remarkably deteriorates the operability. A condition that the illuminating conditions are kept unchanged even if the field emission voltage $V_1$ changes can be satisfied by keeping the focusing action onto the electron beam unchanged. As is apparent from the foregoing, an illuminating system in which both the electrostatic focusing action and the magnetic focusing action are kept unchanged can be realized by changing $V_2$ and I interlocking with the change of $V_1$ so that $V_2/V_1$ and $IN/\sqrt{V_1}$ are kept in predetermined values, respectively.

An example in which power sources are connected in series with each other is shown in FIG. 1. With such a construction, even in the case where the output of each power source is short-circuited by a discharge, there becomes large a possibility that a discharge current is closed through only one power source, which facilitates a protective measure to counter discharges. Further, with this construction, reference potentials of the power source for applying the field emission voltage, the power source for applying the voltage to the first-stage acceleration voltage and a power source for supplying a current to the magnetic lens can be derived from one location so that the interlocking of the power sources with each other can be easily effected.

DESCRIPTION OF THE PREFERRED EMBODIMENTS

An embodiment of the present invention will now be explained by virtue of FIG. 1.

Figure 1:
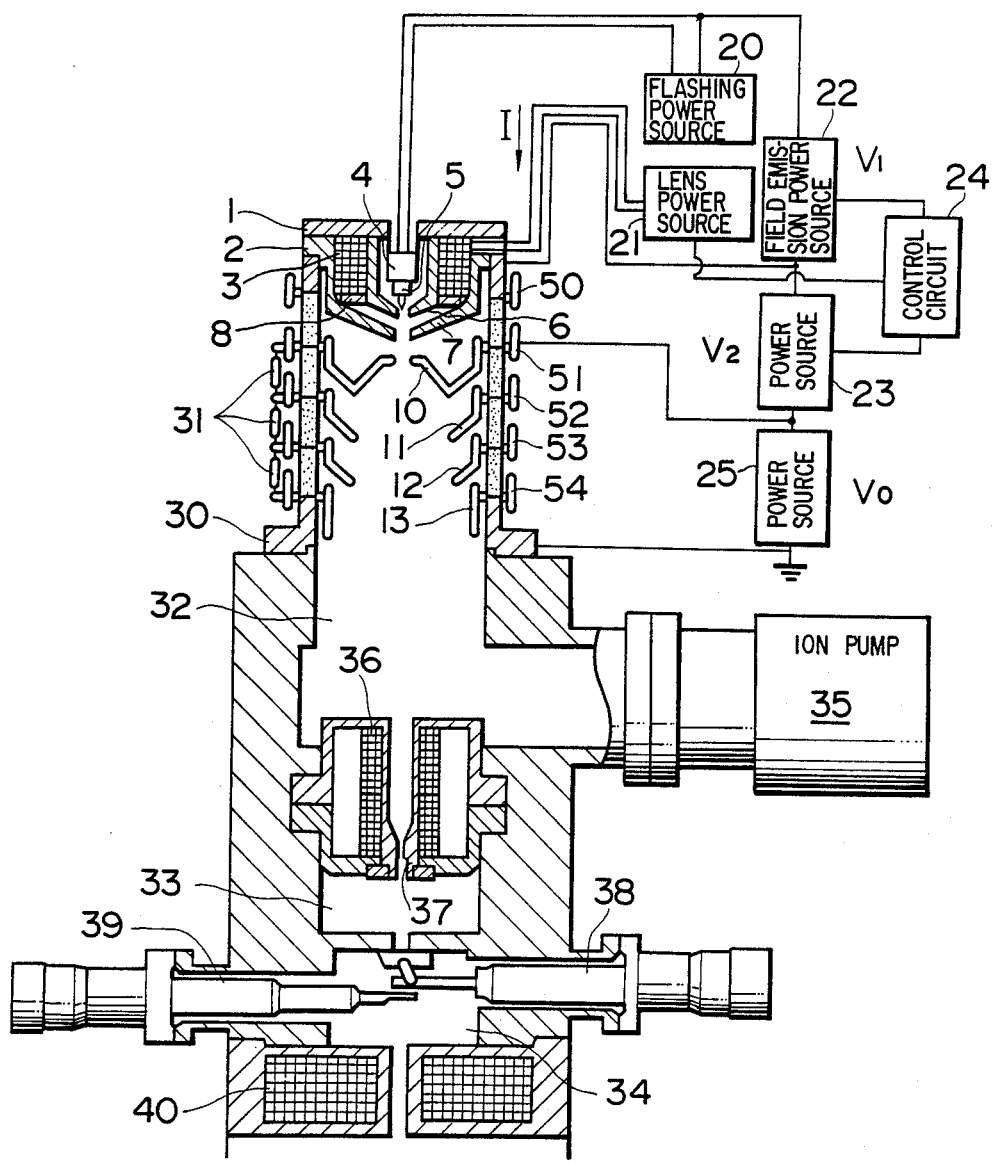
FIG. 1 shows a cross section of a magnetic field superposed field emission electron gun system with a multi-stage acceleration tube according to an embodiment of the present invention taken along a direction of axis of the electron gun and also shows the connection of power sources.
Figure 2:
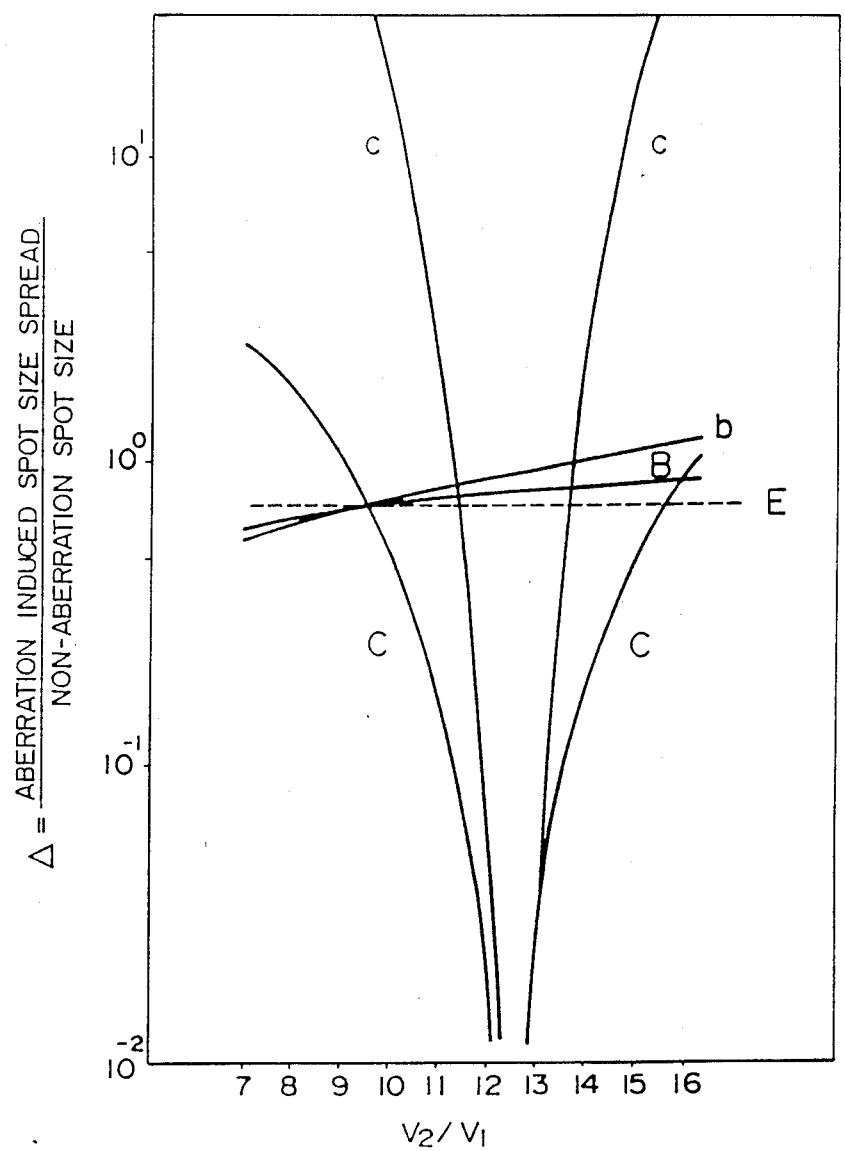
FIG. 2 is a graph showing an example of the relationship between the operating condition of an electrostatic lens and the aberrations of the electrostatic lens and a condenser lens plotted for the conventional field emission electron gun system with a multi-stage acceleration tube.
Figure 3:
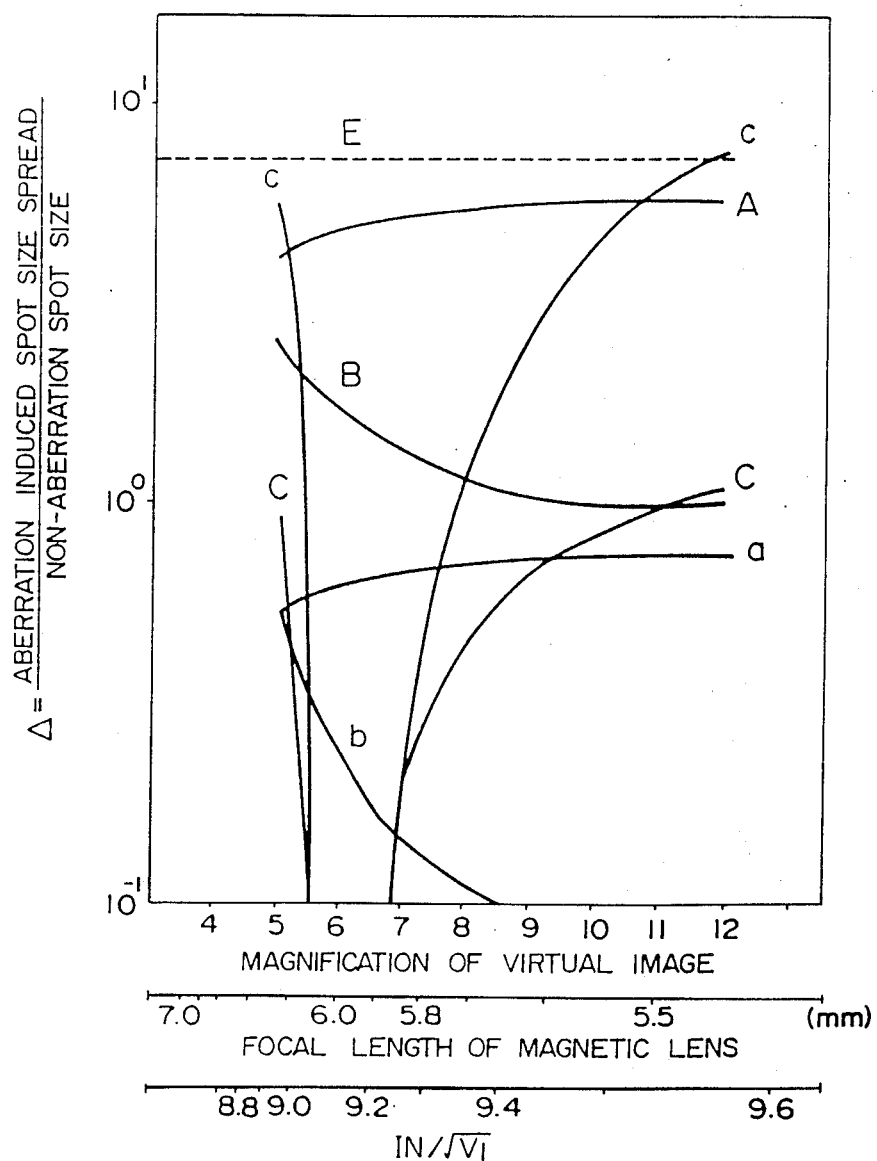
FIG. 3 is a graph showing an example of the relationship between the operating conditions of a magnetic lens and the aberration of the magnetic lens, an electrostatic lens and a condenser lens plotted for a magnetic field superposed field emission electron gun, system with a multi-stage acceleration tube.
Figure 4:
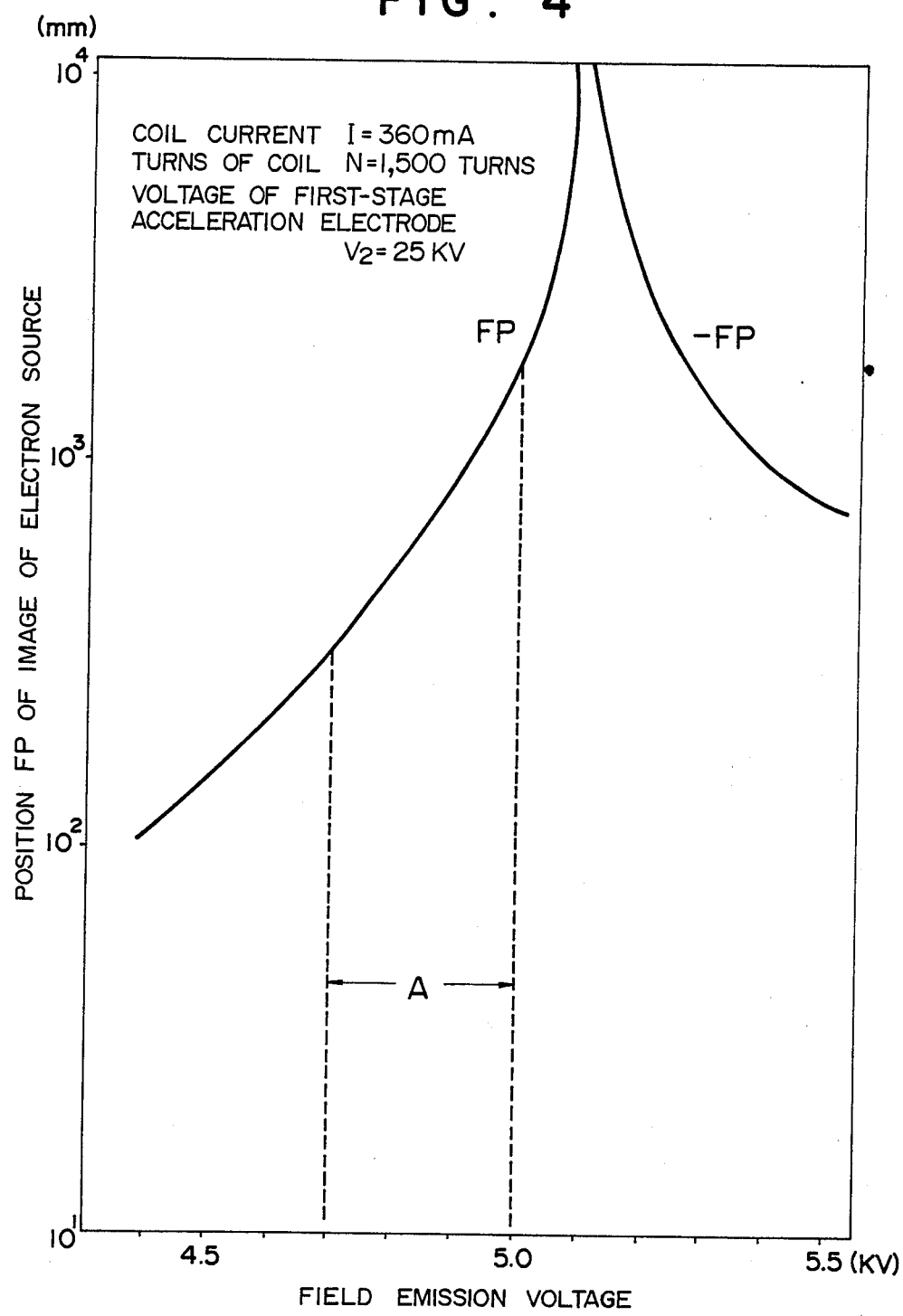
FIG. 4 is a graph of the results of computation of the position of an image of an electron source for a magnetic field superposed field emission electron gun system with a multi-stage acceleration tube when a field emission voltage $V_1$ is changed.

Referring to FIG. 1, the upper portion of a multi-stage acceleration tube 30 is surmounted with a magnetic lens including a flange 1, a yoke 2 and a coil 3. The multi-stage acceleration tube or acceleration electrode assembly 30 is provided with protection electrodes 50 to 54 attached to an outer periphery thereof and is placed in an atmosphere of highly insulative gas such as sulfur hexafluoride for prevention of discharges. The yoke 2 is constructed by upper and lower magnetic poles 6 and 7 made of a metal having a large saturation flux density and a non-magnetic metal 8. The upper and lower poles 6 and 7 are magnetically isolated from each other by the non-magnetic metal 8. An insulator 4 and a field emission electron source 5 are attached to the flange 1. The tip (or pointed end) of the field emission electron source 5 is positioned in the vicinity of a hole of the upper pole 6. Between the field emission electron source 5 and the magnetic lens is applied a field emission voltage $V_1$ from a field emission power source 22. $V_1$ is a potential seen from the field emission electron source 5. In the present embodiment, the upper pole 6 also serves as a field emission electrode. A coil current I is supplied to the coil 3 from a lens power source 21. The field emission electron source 5 is connected to a flashing power source 20 so that it can be heated by means of the flow of an electric current. A first-stage acceleration electrode 10 is provided facing the lower pole 7. A voltage the potential of which is $V_2$ when seen from the field emission electron source 5, is applied to the first-stage acceleration electrode 10 from a $V_2$ power source 23. The lens power source 21 and the $V_2$ power source 23 are controlled through a control circuit 24 in a manner interlocking with the output voltage $V_1$ of the field emission power source 22 so that $IN/\sqrt{V_1}$ (N: the number of windings of the coil 3) and $V_2/V_1$ are kept in predetermined values, respectively. In the present embodiment, the control is made so that $IN/\sqrt{V_1}$ and $V_1/V_2$ can take any value in a range of 7 to 12 and any value in a range of 5 to 10, respectively. Three stages of acceleration electrodes 11 to 13 are disposed below the first-stage acceleration electrode 10 and are applied with dividual voltages through a voltage dividing resistor 31 (about 1 GΩ) from a $V_0$ power source so that the potential of the final-stage acceleration electrode 13 is $V_0$ when seen from the field emission electron source 5. An illuminating system including an electron gun chamber 32, an intermediate chamber 33 and a condenser lens assembly 34 are provided below the multi-stage acceleration tube 30. The electron gun chamber 32 is exhausted by an ion pump 35 down to $10^{-8}$ Pa. A differential exhaust diaphragm 37 is provided between the electron gun chamber 32 and the intermediate chamber 33, and a partition valve 38 is provided between the intermediate chamber 33 and the condenser lens assembly 34. With such a construction, electrons emitted from the field emission electron source 5 by the field emission voltage $V_1$ pass through the holes of the upper and lower poles 6 and 7 of the magnetic lens and are accelerated up to a predetermined energy by the first-stage acceleration electrode 10 and the subsequent acceleration electrodes 11 to 13. Thereafter, the accelerated electrons pass through the electron gun chamber 32, the a deflection yoke 36, the differential exhaust diaphragm 37, the intermediate chamber 33, a condenser diaphragm 39 and a condenser lens 40 and are impinged upon a specimen (not shown).

As is apparent from the foregoing, according to the present invention, even if the field emission voltage $V_1$ changes upon use of the electron gun system (for example, in the case where it is desired to increase a beam current or in the case where it is desired to done over again flashing), the illuminating conditions such as the divergence angle of the beam and the brightness thereof remain unchanged. When the electron gun system is used in an electron microscope or the like, excellent operability can be enjoyed since troublesome operations such as re-adjustment of the brightness are not required. Also, even if a discharge occurs, the power sources are hard to undergo damages. Further, the electron beam obtained by the field emission electron gun system according to the present invention has a brightness which is twice as great as the brightness obtained by the conventional field emission electron gun system and a beam current which is twenty times as great as the beam current obtained by the conventional system.

We claim:

1. A field emission electron gun system with a multi-stage acceleration tube comprising:
    a source of field emission electrons;
    a field emission electrode for extracting the electrons;
    a magnetic lens having a magnetic gap between said field emission electron source and said field emission electrode or a magnetic lens having a magnetic pole which also serves as said field emission electrode;
    an acceleration elecrtrode assembly including at least two stages of acceleration electrodes for accelerating the electrons;
    current interlocking means for changing a magnetization current I for said magnetic lens interlocking with a voltage $V_1$ applied between said field emission electron source and said field emission electrode so that $IN/\sqrt{V_1}$ a predetermined value, N being the number of windings of said magnetic lens; and
    voltage interlocking means for changing a voltage $V_2$ applied between said field emission electron source and the first-stage acceleration electrode of said acceleration electrode assembly interlocking with said voltage $V_1$ applied between said field emission electron source and said field emission electrode so that $V_2/V_1$ takes a predetermined value.

2. A field emission electron gun system with a multi-stage acceleration tube according to claim 1, wherein the relations of $4 \text{ mm} \leq D_1 \leq 10 \text{ mm}$, $D_1 \leq D_2 \leq 20 \text{ mm}$ and $D_1 \leq L \leq D_2$ are satisfied, $D_1$ being the diameter of a hole of a magnetic pole of said magnetic lens on its electron beam incidence side, $D_2$ being the diameter of a magnetic pole of said magnetic lens on its electron beam exit side and L being a gap length between said magnetic poles in an electron beam path.

3. A field emission electron gun system with a multi-stage acceleration tube according to claim 1, wherein the value of $IN/\sqrt{V_1}$ is in a range of 7 to 12 and the value of $V_2/V_1$ is in a range of 5 to 10.

4. A field emission electron gun system with a multi-stage acceleration tube according to claim 1, wherein a distance between said field emission electron source and an electron beam permeable hole provided in a lower magnetic pole of said magnetic lens or a surface of said field emission electrode opposing said first-stage acceleration electrode is not greater than 20 mm.

5. A field emission electron gun system with a multi-stage acceleration tube according to claim 1, wherein a power source for applying a voltage between said field emission electron source and said field emission electrode, a power source for applying a voltage to said first-stage acceleration electrode and a power source for applying voltages to the second-stage to final-stage acceleration electrodes of said acceleration electrode assembly are connected in series with each other and a lens power source for supplying a current to said magnetic lens is floating at the same potential as said field emission electrode.

6. A field emission electron gun system with a multi-stage acceleration tube comprising:
    a source of field emission electrons;
    a field emission electrode for extracting the electrons;

a magnetic lens having a magnetic gap between said field emission electron source and said field emission electrode or a magnetic lens having a magnetic pole which also serves as said field emission electrode;

at least two stages of acceleration electrodes for accelerating the electrons; and an electronic optical system in which a virtual image of said electron source 4 to 10 times as great as said electron source is formed by said magnetic lens and a real image of said electron source 0.3 to 3 times as great as said virtual image is formed by an electrostatic lens.

* * * * *